United States Patent
Guiffant et al.

[11] Patent Number: 5,818,881
[45] Date of Patent: Oct. 6, 1998

[54] DIGITAL FREQUENCY DEMODULATOR

[75] Inventors: Yves Robert Pierre Jean Guiffant, Fontenary Aux Roses; Joël Marc Vanoli, Ermont, both of France

[73] Assignee: Societe Nationale d'Etude et de Construction de Moteurs d'Aviation "Snecma", Paris, France

[21] Appl. No.: 702,049

[22] Filed: Aug. 23, 1996

[30] Foreign Application Priority Data

Aug. 30, 1995 [FR] France ................... 95 10198

[51] Int. Cl.$^6$ ................... H04L 27/156
[52] U.S. Cl. ................... 375/334; 329/303; 329/343; 455/337
[58] Field of Search ................... 375/271, 273, 375/275, 316, 322, 324, 328, 334, 335; 329/300, 303, 315, 318, 327, 341, 343; 455/42, 205, 214, 337; 327/31, 33, 35, 37–39, 44–49; 324/75.41, 76.42, 76.47, 76.48

[56] References Cited

U.S. PATENT DOCUMENTS

| 3,876,945 | 4/1975 | Gossel | 455/212 |
|---|---|---|---|
| 4,470,296 | 9/1984 | Kobayashi et al. | 73/113 |
| 4,551,846 | 11/1985 | Takeda et al. | 375/328 |
| 4,574,247 | 3/1986 | Jacob | 329/300 |
| 5,311,556 | 5/1994 | Baker | 375/334 |
| 5,339,333 | 8/1994 | Zehngut et al. | 375/334 |
| 5,483,193 | 1/1996 | Kennedy et al. | 329/300 |
| 5,550,505 | 8/1996 | Gaus, Jr. | 329/300 |

FOREIGN PATENT DOCUMENTS

| 0 175 947 | 4/1986 | European Pat. Off. |
| 29 28 976 | 2/1981 | Germany |

*Primary Examiner*—Amanda Le
*Attorney, Agent, or Firm*—Oblon, Spivak, McClelland, Maier & Neustadt, P.C.

[57] ABSTRACT

A digital frequency demodulator includes a first counter and a second counter measuring the instantaneous and mean values of the period of a frequency modulated signal. A comparator compares the values measured and creates a binary signal of the same frequency as the modulation signal. The measurement of the instantaneous value of the frequency modulated signal is effected by counting the number of reference clock pulses during a period of the modulated signal, and the measurement of the mean value is effected by counting the number of pulses of a clock signal of frequency N times lower than the reference clock during N periods of the modulated signal.

12 Claims, 2 Drawing Sheets

DIGITAL FREQUENCY DEMODULATOR

BACKGROUND OF THE INVENTION

1. Field of the Invention

The present invention relates to a digital frequency demodulator for digitally demodulating frequency-modulated signals such as, for example, signals relating to the measurement of speed, proximity or movement as provided by eddy current sensors.

2. Summary of the Prior Art

The demodulation of a frequency-modulated signal is generally effected by means of a frequency discriminator composed of a closed circuit, termed a phase loop, including a phase comparator, a filter, an amplifier and a variable frequency oscillator (VCO). The frequency-modulated signal and the signal emitted by the oscillator are applied to the inputs of the phase comparator, which outputs a signal proportional to the phase difference between the frequencies of the two input signals. After filtering and amplification, the signal emitted by the comparator is used to control the variable frequency oscillator so as to control the frequency of the oscillator according to the frequency of the frequency-modulated signal. However, the demodulation circuits effecting a control loop are analogue devices which are difficult to fine tune and are subject to instability. The initial frequency of the VCO must not differ too much from the frequency of the signal to be demodulated for the hooking of the control loop to occur.

SUMMARY OF THE INVENTION

It is an object of the invention to provide a frequency demodulator which does not suffer from the drawbacks of the known demodulation devices discussed above.

A further object of the invention is to provide a low cost fully digital frequency demodulator having high precision, high stability, and small overall size.

For this purpose, the invention proposes measuring the instantaneous and mean values of the period of the frequency modulated signal, comparing the values measured and generating a binary signal which changes state each time the result of the comparison changes sense.

More particularly, the invention provides a digital frequency demodulator for demodulating a frequency modulated signal, comprising:

means for measuring the instantaneous value of the period of said frequency modulated signal;

means for measuring the mean value of the period of said frequency modulated signal; and comparison means for comparing the measured instantaneous value with the measured mean value and recreating the frequency of the modulation signal which was used in generating said frequency modulated signal.

The instantaneous value of the period of the frequency modulated signal is preferably measured by counting the number of periods of a reference clock contained in a period of the frequency modulated signal.

The mean value of the period of the frequency modulated signal is preferably measured by counting the number of periods of a clock signal, of frequency N times lower than that of the reference clock, contained in N periods of the frequency modulated signal. The binary signal generated thus changes its logic state at the rhythm of the variations of the instantaneous period of the frequency modulated signal and has the same frequency as the modulation signal.

Other preferred features and advantages of the invention will become apparent from the following description of the preferred embodiment, given by way of non-limitative example, with reference to the attached drawings.

DESCRIPTION OF THE PREFERRED EMBODIMENT

Figure 1:
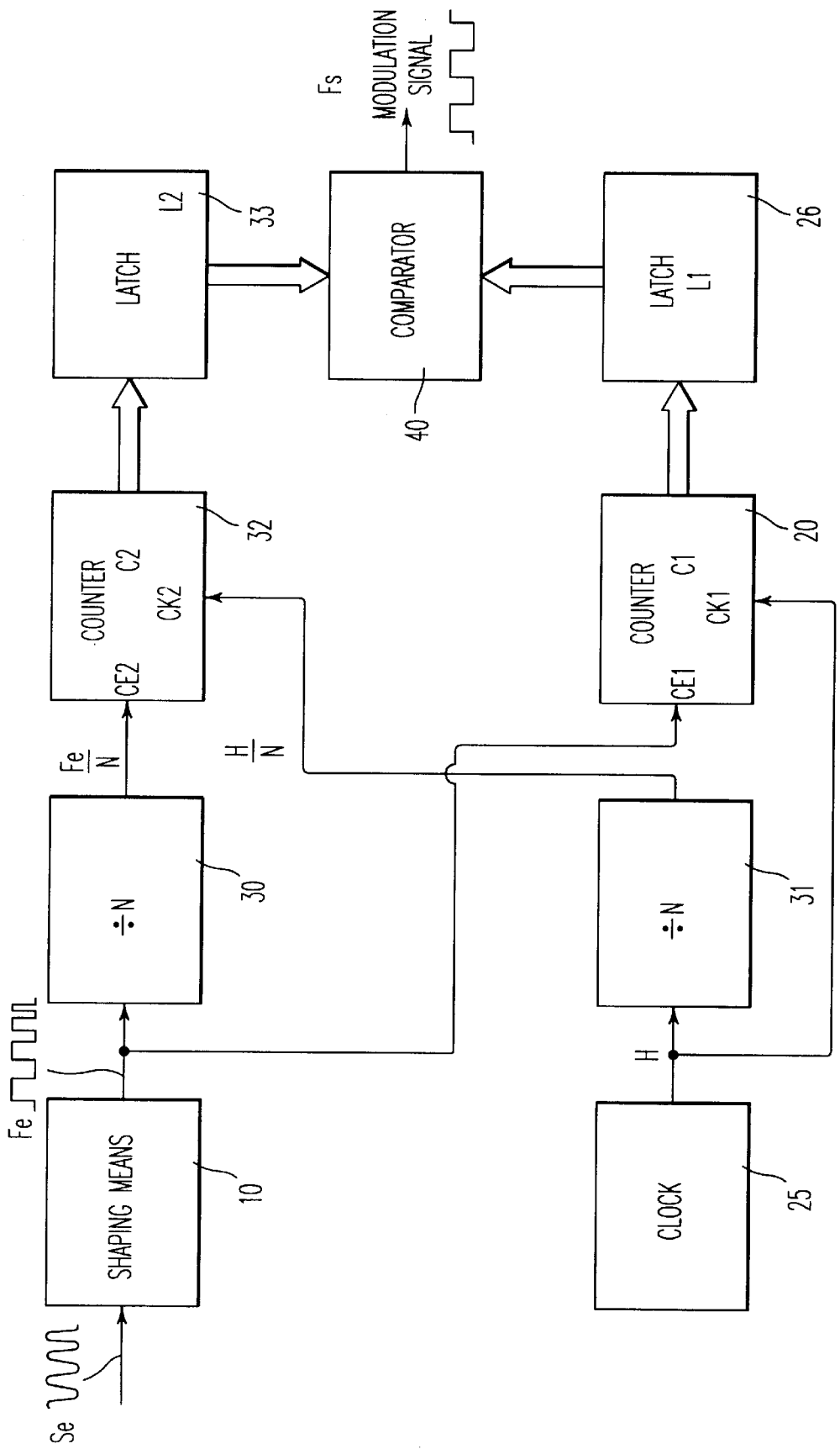
FIG. 1 is a block diagrammatic representation of a preferred embodiment of the frequency demodulator of the invention; and, FIG. 2 shows timing diagrams representing, for a clock signal and a particular frequency modulated signal, the development of various signals output from the measuring means and the comparison means of the frequency demodulator of the invention.

The frequency demodulator represented in FIG. 1 comprises means 10 for shaping a frequency modulated signal, and, in accordance with the invention, means for measuring the instantaneous value of the period of the frequency modulated signal, means for measuring the mean value of the period of the frequency modulated signal, and means for comparing the instantaneous and mean values of said period and for recreating the frequency of the modulation signal.

The shaping means 10 are arranged to convert a frequency modulated analogue signal Se into a logic signal Fe.

The means for measuring the instantaneous value of the period of the frequency modulated signal comprises a counter (C1) 20 having a first input CE1 to which the logic signal Fe is supplied and a second input CK1 to which is supplied a clock signal H originating from a reference clock 25. The clock 25 is selected so that its frequency is much higher than the frequency of the signal Fe, and so as to possess very high stability in time.

The counter 20 is arranged to perform successive counting cycles, the length of each cycle corresponding to a period Te of the frequency modulated signal. In every counting cycle the counter 20 counts the number of pulses p of the clock signal H contained in the respective period Te of the logic signal Fe. This number of pulses p corresponds to the instantaneous value of the period Te of the logic signal Fe related to the period of the signal H emitted by the reference clock 25.

Counting may be performed between two rising fronts, two descending fronts or any other reference combinations of the logic signal Fe, and may be performed synchronously or asynchronously. At the end of the counting period, the content p of the counter 20 is transferred to a buffer register or latch (L1) 26 by an additional control logic device (not shown), and then reset to zero. A new counting cycle is then performed for the following period of the signal Fe.

The means for measuring the mean value of the period of the frequency modulated signal comprises first and second dividers 30, 31 for respectively receiving the logic signal Fe and the clock signal H and for dividing these signal by an integer N which may be programmable. The divided signals Fe/N and H/N respectively output from the dividers 30, 31 are supplied to first and second inputs CE2 and CK2 respectively of a counter (C2) 32. This counter 32 counts the number of pulses q of the clock signal H/N contained in N periods Te of the logic signal Fe. If the value N is sufficiently high, the number q represents the mean value of the period Te related to the period of the signal H emitted by the reference clock 25. The counting may be performed between (N+1) rising fronts, (N+1) descending fronts or any other reference combination of the signal Fe/N, and may be effected synchronously or asynchronously.

At the end of the N periods of counting, the content q of the counter 32 is transferred to a buffer register or latch (L2) 33 by the additional control logic device (not shown), and then reset to zero. A new counting cycle is then effected over the following N periods of the signal Fe.

The measurements of the instantaneous and mean values of the period Te of the logic signal Fe are carried out simultaneously and in parallel. The contents p and q of the buffer registers or latches 26, 33 are permanently compared by a comparator 40, the latter possibly being provided with a hysteresis, and the comparator issues a binary output signal Fs with two logic states 0 or 1, the binary signal changing its logic state each time the result of the comparison changes direction. For example, when the instantaneous value is higher than the mean value of the period Te, the output from the comparator is in a predetermined logic state 0 or 1, and when the instantaneous value falls below the mean value, the logic state of the comparator output changes. The signal Fs thus changes its logic state with the rhythm of the variations of the instantaneous period Te and recreates the frequency of the modulation signal.

Figure 2:
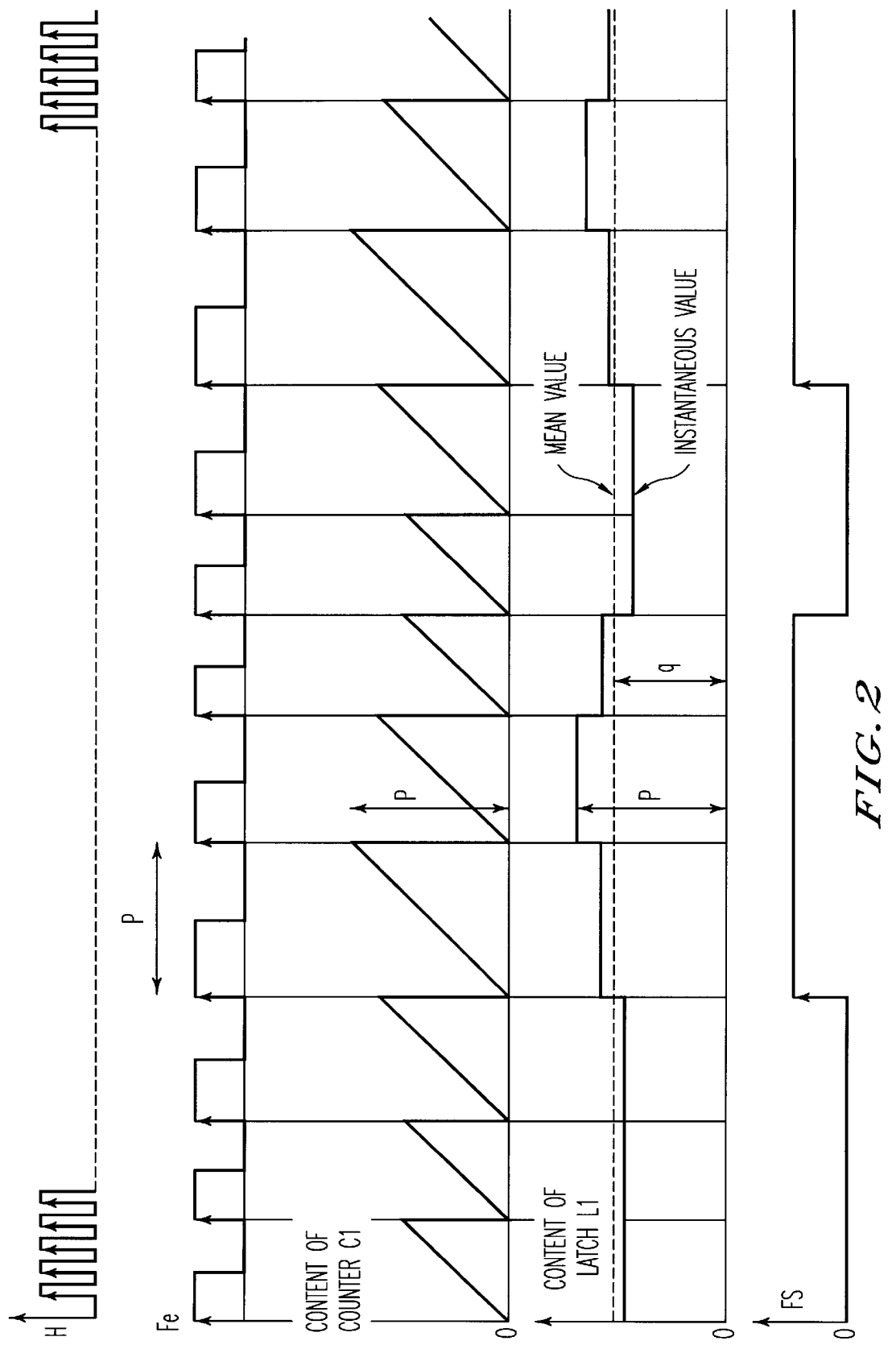

FIG. 2 shows, by way of example, timing diagrams illustrating, for a clock signal H and a particular logic signal Fe, the changes in the contents of the counter C1 and the latch L1 through ten periods of the signal Fe, as well as the output signal of the comparator. These diagrams show that the variations of the content of the latch L1 reproduce the variations of the period Te of the logic signal Fe and are representative of the instantaneous values of the period Te. Superimposed on the diagram showing the content of the latch L1 is a dotted line representing the mean value of the period Te, this mean value being the value measured by the counter C2. The bottom timing diagram in FIG. 2 shows the logic output signal Fs of the comparator 40. On this timing diagram the output of the comparator is in the logic state 0 when the instantaneous value of the period Te is lower than the mean value of the period Te, and is in the logic state 1 when the instantaneous value is higher than the mean value.

The digital frequency demodulator described hereinabove has several advantages. Since its operation is based on a counting principle, it exhibits an integrating effect which guarantees a good immunity to noise. Also, the possibility of programming the value N of the dividers 30, 31 enables the best compromise to be selected between the precision and the response time desired for a given application. Furthermore, the demodulator is fully digital and therefore free from any drift, and requires no setting. It can easily be integrated, at low cost, in a single unitary component which is directly interfaceable with a microprocessor bus. Finally, its open loop structure and the absence of a frequency discriminator make it possible to avoid the problems inherent in demodulators which have phase loops, particularly problems of stability and limitation of the admissible frequency ranges.

The demodulator of the invention is particularly well suited to the processing of signals for which the drift of the carrier (for example with temperature) is far higher than the modulation rate of the useful signal.

We claim:

1. A digital frequency demodulator for demodulating a frequency modulated signal, comprising:

a first counter for measuring an instantaneous value of a period of said frequency modulated signal;

a second counter for measuring a mean value of the period of said frequency modulated signal and comparison means for comparing the measured instantaneous value with the measured mean value and recreating the frequency of the modulation signal which was used in generating said frequency modulated signal;

wherein the measurements of said instantaneous and mean values of the period of said frequency modulating signal are carried out simultaneously and in parallel.

2. A digital frequency demodulator according to claim 1, wherein said frequency modulated signal is an analogue signal, and said demodulator includes means for converting said analogue signal into a logic signal.

3. A digital frequency demodulator according to claim 2, wherein said demodulator includes a reference clock providing a clock signal having a frequency much greater than the frequency of said frequency modulated signal, and said first counter having a first input to which said frequency modulated signal is supplied and a second input to which said clock signal is supplied.

4. A digital frequency demodulator according to claim 3, wherein said first counter is adapted to perform successive counting cycles, each counting cycle consisting of counting the number of pulses of said clock signal received from said reference clock in a period of said frequency modulated signal.

5. A digital frequency demodulator according to claim 4, further comprising a first buffer register connected to said first counter and adapted to receive the count from said first counter at the end of each counting cycle.

6. A digital frequency demodulator according to claim 5, wherein said second counter has a first input to which a first divided signal output from a first divider means is supplied and a second input to which a second divided signal output from a second divider means is supplied, said first and second divider means respectively receiving said frequency modulated signal and said clock signal.

7. A digital frequency demodulator according to claim 6, wherein said second counter is adapted to count the number of pulses of the signal received at its second input, said signal having a frequency N times lower than said reference clock signal, through N periods of said frequency modulated signal.

8. A digital frequency demodulator according to claim 7, further comprising a second buffer register connected to said second counter and adapted to receive the count from said second counter at the end of the N counting periods.

9. A digital frequency demodulator according to claim 8, wherein said comparison means is connected to said first and second buffer register and is adapted to permanently compare the content of said first buffer register with the content of said second buffer register.

10. A digital frequency demodulator according to claim 9, wherein said comparison means is adapted to output a binary signal with two logic states 0 or 1, said logic state of said binary signal changing each time the result of the comparison of the contents of the first and second buffer registers changes direction.

11. A digital frequency demodulator according to claim 3, wherein said second counter has a first input to which a first divided signal output from a first divider means is supplied and a second input to which a second divided signal output from a second divider means is supplied, said first and second divider means respectively receiving said frequency modulated signal and said clock signal.

12. A digital frequency demodulator according to claim 11, wherein said second counter is adapted to count the number of pulses of the signal received at its second input, said signal having a frequency N times lower than said reference clock signal, through N periods of said frequency modulated signal.

* * * * *

UNITED STATES PATENT AND TRADEMARK OFFICE
CERTIFICATE OF CORRECTION

PATENT NO. : 5,818,881
DATED : OCTOBER 6, 1998
INVENTOR(S) : Yves R. P. J. GUIFFANT et al.

It is certified that error appears in the above-identified patent and that said Letters Patent is hereby corrected as shown below:

In column 2, line 55, change "signal" to --signals--.

Signed and Sealed this

Eighteenth Day of May, 1999

Attest:

Q. TODD DICKINSON

*Attesting Officer*     *Acting Commissioner of Patents and Trademarks*